United States Patent [19]

Majkrzak et al.

[11] 4,361,372
[45] Nov. 30, 1982

[54] CONNECTOR PANEL FOR AN ELECTRONIC CABINET

[75] Inventors: Charles P. Majkrzak, Nutley; Thomas R. Phillips, Upper Montclair, both of N.J.

[73] Assignee: International Telephone and Telegraph Corporation, New York, N.Y.

[21] Appl. No.: 191,040

[22] Filed: Sep. 25, 1980

[51] Int. Cl.³ .......................................... H01R 13/62
[52] U.S. Cl. .................................... 339/64 M; 339/65
[58] Field of Search ............................. 339/64, 65, 66

[56] References Cited

U.S. PATENT DOCUMENTS 2,871,457  1/1959  Jencks et al. ............... 339/64 M
2,954,543  9/1960  Rayer et al. ............... 339/64 M Primary Examiner—Joseph H. McGlynn
Attorney, Agent, or Firm—John T. O'Halloran; Alfred C. Hill

[57] ABSTRACT

An arrangement is disclosed for an electronic cabinet housing at least one removable electronic chassis enabling n plugs mounted on one of the chassis and the cabinet to reliably engage n receptacles mounted on the other of the chassis and the cabinet, where n is a natural number including one. The arrangement includes a cabinet connector panel having at least one opening therein; a floating connector plate carrying the cabinet mounted one of the n plugs and the n receptacles, the plate being disposed in the panel opening to enable each of the cabinet mounted one of the n plugs and the n receptacles to engage an associated one of the chassis mounted one of the n receptacles and n plugs; and a preloaded spring arrangement connected between the panel and the plate enabling axial and radial displacement of the plate with respect to the panel to compensate for manufacturing tolerances of the cabinet, the chassis, the n receptacles and the n plugs and thereby ensure a reliable engagement of the n plugs with the n receptacles.

38 Claims, 9 Drawing Figures

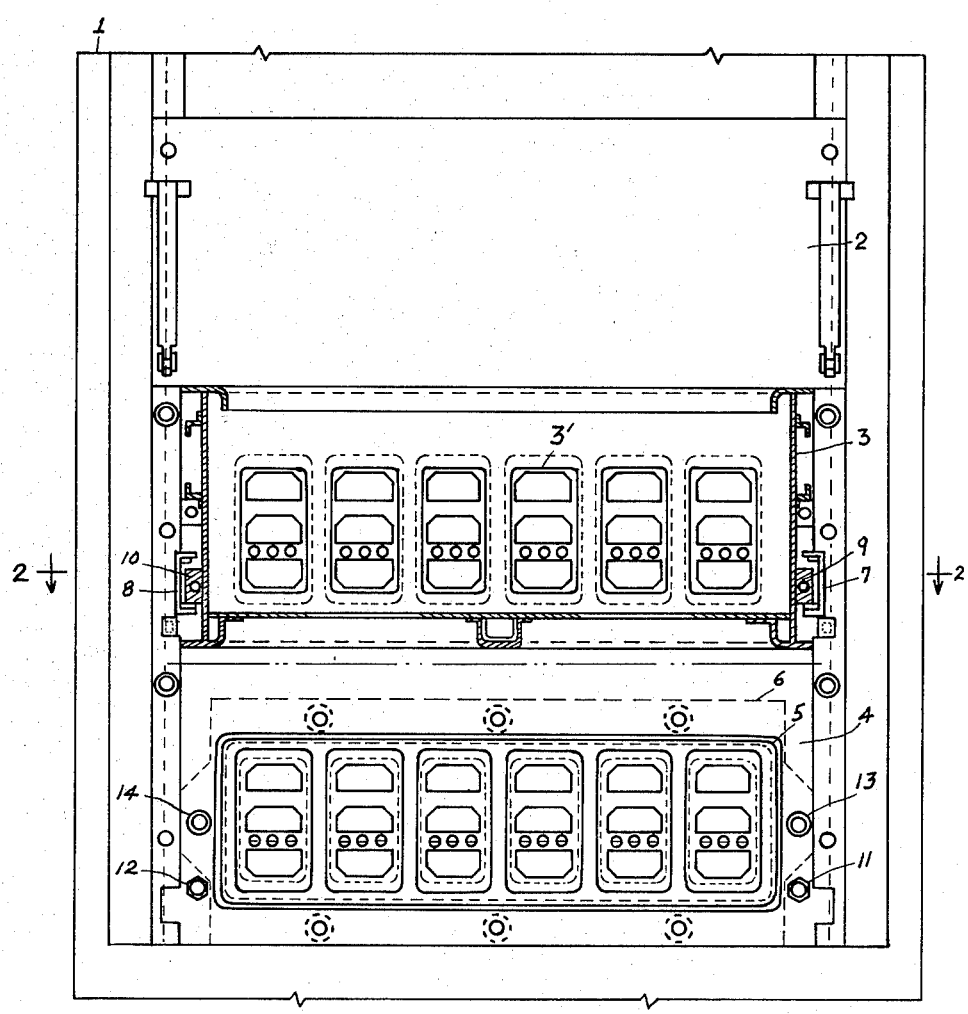

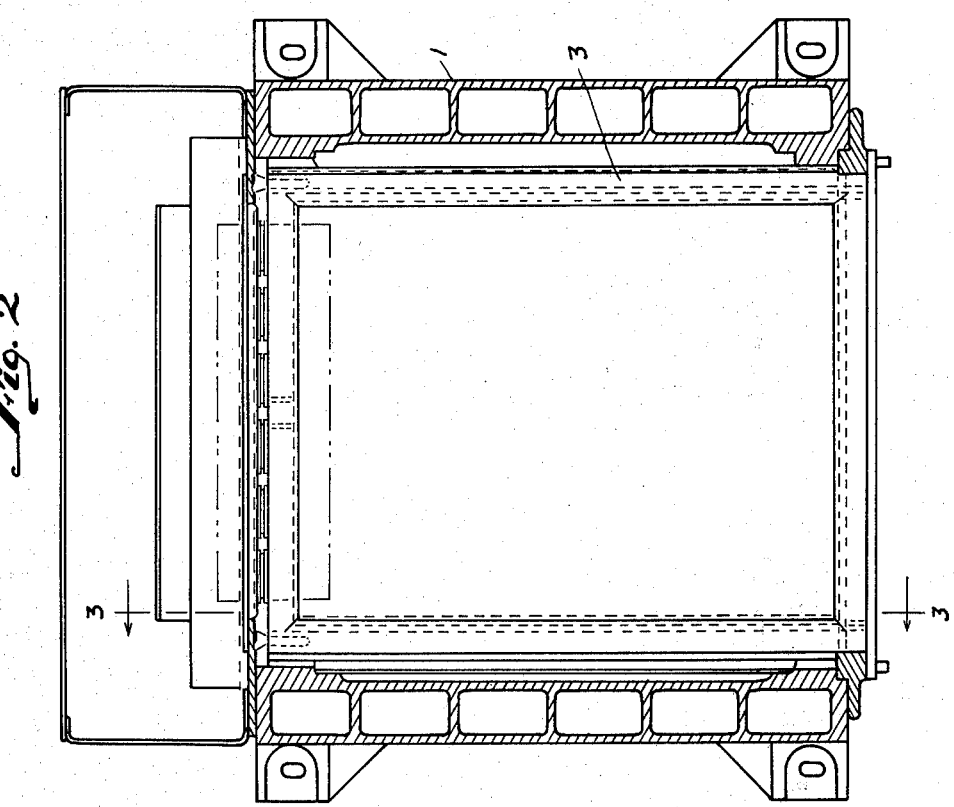
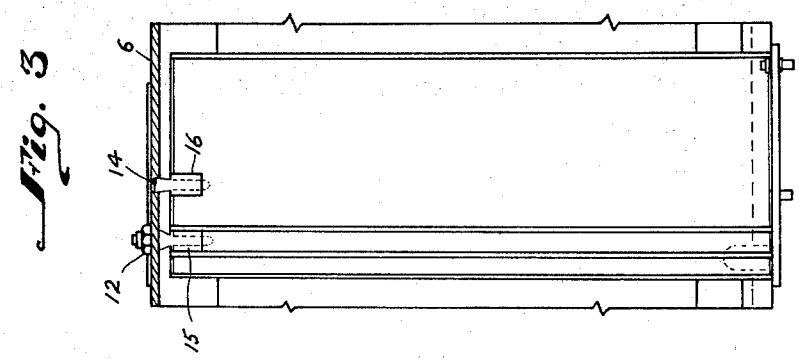

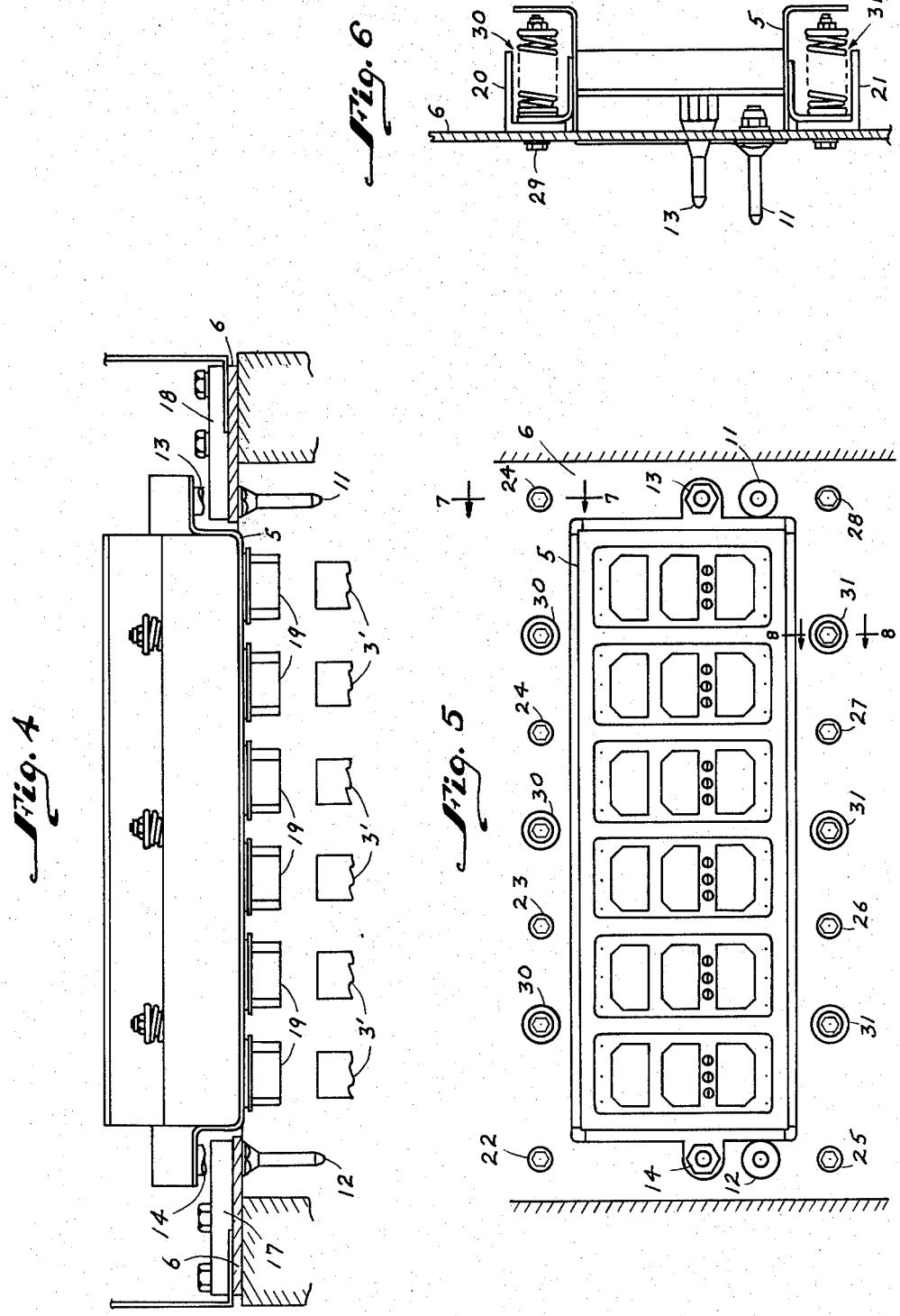

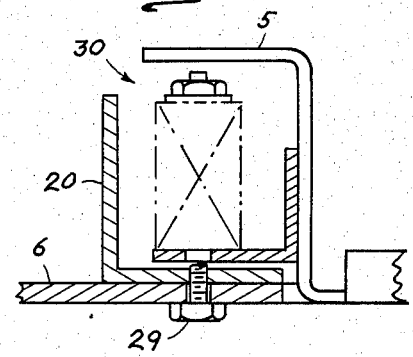
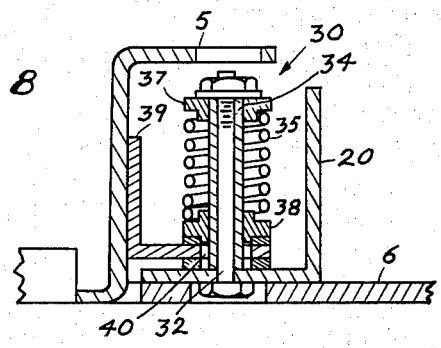
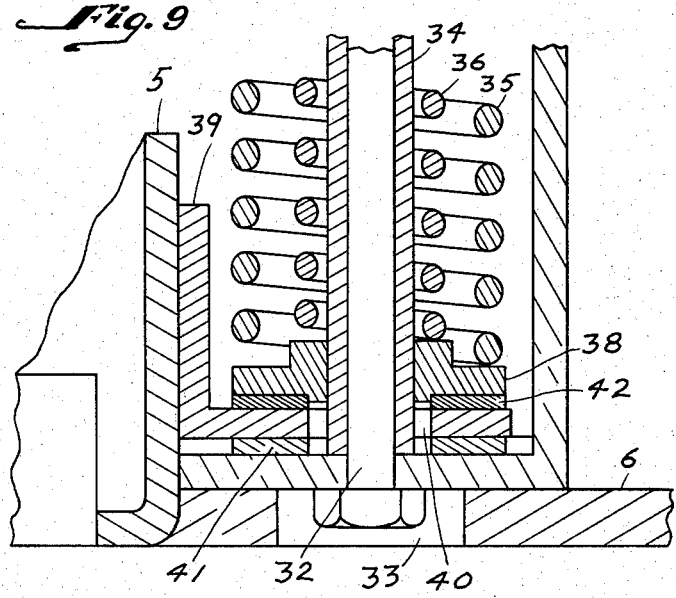

CONNECTOR PANEL FOR AN ELECTRONIC CABINET

BACKGROUND OF THE INVENTION

The present invention relates to electronic cabinets capable of slidably receiving therein one or more chassis and, more particularly to a connector panel to enable plugs mounted on one of the chassis and the cabinet to reliably engage receptacles mounted on the other of the chassis and the cabinet even in the presence of normally unacceptable manufacturing tolerances.

It is well known that in the communication, navigation, computer and like industries manufacturing electronic systems that the electronic systems are made up of a plurality of subsystems with one or more of the subsystems being assigned to a particular chassis. The plurality of chassis are normally slidably mounted in a cabinet such that one or more cabinets house the electronic system. It is required that the chassis be slidably received in the cabinets in a manner enabling the individual chassis to be slid out of the cabinets for maintenance, repair and/or replacement. Additionally, there must be provided electrical connections for power and/or signal paths between the various chassis with this interchassis connection being connected to the cabinet so as not to interfere with the slidable ability of the chassis relative to the cabinet. This necessitates a connector between the chassis and the cabinet, with cables in the cabinet providing the interconnection between the chassis for power and/or signal paths. Due to the slidability of the chassis relative to the cabinet, it is the usual practice to have a plurality of connector panels in the cabinet each containing either a plurality of receptacles or a plurality of plugs and each of the chassis have either a plurality of mating plugs or receptacles which are to engage the cabinet-mounted mating receptacles or plugs of an associated one of the plurality of connector panels.

The introduction of a low-insertion force, multiple-pin panel-to-panel connector of up to 104 connections per section with three sections to a connector or a total of 312 pins to a connector, has encouraged the practical use of six such connectors or 1872 wire connections per electronic chassis at its cabinet interface. The normal connector design has a built-in capability to permit a misalignment of up to 0.030 inches with the retention of reliable engagement of a plug with a mating receptacle. This freedom permits the cluster of six plugs to engage reliably when the chassis is referenced and aligned with mating receptacles through the use of a basic pin and socket system at the chassis-cabinet interface to align the cluster of plugs with the cluster of receptacles.

As can be seen and as is well known in the art, the misalignment of 0.030 inches provided by the normal connector design requires very precise matching of the cabinet depth and width with the chassis depth and width and a precise manufacturing of the sliding arrangement enabling the chassis to be slid relative to the cabinet. This precise machining adds to the cost of the electronic cabinet and its associated chassis to provide the desirable reliable engagement between the cluster of plugs and the cluster of receptacles.

Without the precise manufacturing process of the chassis and the cabinet together with their slide arrangement, all of the manufacturing tolerances accumulate resulting in the basic pin and socket system no longer being sufficiently confining to assure a reliable connector alignment for the cluster of plugs and the cluster of receptacles.

SUMMARY OF THE INVENTION

An object of the present invention is to provide a connector panel for an electronic cabinet that will enable a reduction in the manufacturing costs of the cabinet and chassis and yet retain a reliable engagement between the plugs mounted on one of the cabinet and the chassis and the receptacles mounted on the other of the cabinet and chassis.

Another object of the present invention is to provide a floating connector panel for an electronic cabinet which will compensate for manufacturing tolerances and accumulations thereof caused by a practical and economical production process in the manufacture of the chassis, the cabinet and the interconnecting sliding arrangement.

A further object of the present invention is to provide a floating connector panel for an electronic cabinet having a local freedom of movement in the connector panel to which the cabinet receptacles or plugs are mounted so as to align within reliable limits the mating plugs or receptacles mounted on the chassis through a basic pin and socket system even when the manufacturing tolerances in the production of the chassis, the cabinet and the sliding arrangement are relaxed thereby resulting in a reduction in the manufacturing costs of the chassis, the cabinet and the sliding arrangement.

Still a further object of the present invention is to provide a floating connector panel for an electronic cabinet that is capable of axial and radial displacement to compensate for the manufacturing tolerances of the chassis, the cabinet and the interconnecting sliding arrangement and yet enable a reliable engagement between the plugs mounted on one of the cabinet and the chassis and the mating receptacles mounted on the other of the cabinet and the chassis.

A feature of the present invention is the provision of an arrangement for an electronic cabinet having at least one removable electronic chassis enabling n plugs mounted on one of the cabinet and the chassis to reliably engage n receptacles mounted on the other of the cabinet and the chassis, where n is a natural number including one, comprising: a cabinet connector panel having at least one opening therein; a floating connector plate carrying one of the n plugs and the n receptacles, the plate being disposed in the opening to enable each of the one of the n plugs and the n receptacles to engage an associated one of the other of the n plugs and the n receptacles; and preloaded spring means connected between the panel and the plate enabling axial and radial displacement of the plate with respect to the panel to compensate for manufacturing tolerances of the cabinet, the chassis, the n receptacles and the n plugs and thereby ensure a reliable engagement of the n plugs with the n receptacles.

The term "natural number" employed herein has the classical definition namely the number 1 or any number obtained by repeatedly adding 1 to this number.

The preloaded spring means are preloaded to provide sufficient resistance to displacement of the panel so as to assure complete engagement of mating plugs and receptacles. Only after further application of force beyond that required for full engagement of the connectors will the floating connector panel be displaced to compensate for manufacturing tolerances. In this manner, the range of unavoidable dimensional tolerances in the manufacture of the chassis and the cabinet and their interconnecting sliding arrangement will be accommodated to protect the connectors against physical overloads and to assure interchangeability of equipments.

BRIEF DESCRIPTION OF THE DRAWING

Above-mentioned and other features and objects of this invention will become more apparent by reference to the following description taken in conjunction with the accompanying drawing, in which:

FIG. 1 is a vertical front view of an electronic cabinet having the upper chassis in place, a cross section through an intermediate chassis and a bottom chassis removed exposing the floating connector panel of the cabinet;

FIG. 2 is a horizontal cross section along line 2—2 of FIG. 1;

FIG. 3 is a cross sectional view taken along line 3—3 of FIG. 2;

FIG. 4 is a top view of a detail of the cabinet connector panel and the floating connector panel in accordance with the principles of the present invention;

FIG. 5 is a front view of FIG. 4;

FIG. 6 is an end view of FIG. 4;

FIG. 7 is an enlarged view taken along line 7—7 of FIG. 5;

FIG. 8 is an enlarged view taken along line 8—8 of FIG. 5;

FIG. 9 is an enlarged view of a portion of FIG. 8.

DESCRIPTION OF THE PREFERRED EMBODIMENT

The following description will be directed to an arrangement where the receptacles are cabinet mounted and the mating plugs are chassis mounted. However, it is to be understood that the floating connector panel will operate as described if the mounting location of the plugs and receptacles are reversed.

Referring to FIGS. 1-3, there is illustrated therein the cabinet 1 containing a plurality of chassis 2-4 with chassis 2 in place, chassis 3 being vertically cross-sectioned to show chassis mounted plugs 3' and chassis 4 removed to expose the floating connector plate 5 disposed in the cabinet connector panel 6. The chassis 2-4 are slidably received in and capable of being slidably removed from cabinet 1 by the sliding arrangement including the channels 7 and 8 mounted to cabinet 1 receiving slidable parts 9 and 10 mounted to the chassis.

Each of the connector panel arrangements in cabinet 1 have associated therewith a chassis support shock pins 11 and 12 and connector panel alignment pins 13 and 14. Shock pins 11 and 12 engage mating chassis sockets 15 and alignment pins 13 and 14 engage a mating chassis socket 16. The purpose of shock pins 11 and 12 are to provide a coarse alignment between the chassis-mounted plugs and the cabinet-mounted receptacle and also to adequately support the chassis against loads of shock and vibration. The purpose of the connector panel alignment pins 13 and 14 is to provide an intermediate alignment between the chassis-mounted plugs and the cabinet-mounted receptacles with the final alignment being provided by the normal construction of the plug and receptacle which as mentioned hereinabove is normally designed to have a built-in capability to permit a misalignment of up to 0.030 inches with the retention of a reliable engagement between chassis-mounted plugs and cabinet-mounted receptacles.

Referring to FIGS. 4-9, the details of the floating connector plate of the present invention will now be described. The coarse alignment and shock absorbing pins 11 and 12 pass through cabinet connector panel 6 and are secured to a bar 17 and 18, respectively, so that any shock or vibration imparted to pins 11 and 12 are absorbed in the bars 17 and 18, respectively, to reduce any distortion of cabinet connector panel 6 due to shock and vibration. Floating connector plate 5 carries thereon the receptacles 19 which will mate with and reliably engage plugs 3' that are chassis mounted.

The alignment pins 13 and 14 are fastened to floating connector plate 5 and pass through connector panel 6 to provide the intermediate alignment of the chassis-mounted plugs 3' and the cabinet-mounted receptacles 19 with the final alignment being provided by the plug and receptacles themselves due to the normal connector construction as mentioned hereinabove.

Connector panel 6 has fastened thereto the floating connector panel assembly by means of angle-mounting base and stiffening elements 20 and 21 at points 22-24 and 25-28, respectively, by means of bolts such as bolt 29 (FIG. 7). Intermediate these connecting points are disposed spring-loaded cells 30 and 31. As illustrated more clearly in FIGS. 8 and 9, the spring-loaded cells include a bolt 32, which passes through a clearance hole 33 in connector panel 6, bears with its head against the adjacent side of stiffening member 20. Coaxial of a bolt 32 is disposed a preload spacer 34 whose length defines the force of the preload exerted by the preload spring 35. To increase the preload force, a secondary spring 36 may be provided intermediate spring 35 and spacer 34. The springs 35 and 36 act upon spring seat washers 37 and 38 disposed coaxial of bolt 32 at opposite ends of springs 35 and 36. An angled member 39 is rigidly fastened to floating connector plate 5, such as by welding. Member 39 has an aperture 40 therein coaxial of spacer 34 with clearance with respect to spacer 34 of sufficient magnitude to permit radial motion of member 39 with respect to spacer 34. This is what provides the radial displacement of floating plate 5 with respect to panel 6. To make this radial displacement as friction free as possible a first anti-friction device 41 is disposed between stiffener 20 and member 39 and a second anti-friction device 42 is disposed between member 39 and washer 38. First anti-friction device 41 may be provided by delrin strips and second anti-friction device 42 may be provided by a nylon washer.

The axial displacement is provided by springs 35 and 36 of the spring cells 30 and 31. The preload force is set by the spacer 34 such that a reliable engagement is achieved between receptacles 19 and chassis-mounted plugs 3' when there is no accumulation of manufacturing tolerances. When there is an accumulation of detrimental manufacturing tolerances and further insertion of the chassis into the cabinet is required for reliable support, the preload force will be overcome and floating plate 5 will move axially against springs 35 and 36 to compensate for the accumulated manufacturing tolerances and enable the maintainence of desired reliable engagement between receptacles 19 and plugs 3'.

While we have described above the principles of our invention in connection with specific apparatus it is to be clearly understood that this description is made only by way of example and not as a limitation to the scope of our invention as set forth in the objects thereof and in the accompanying claims.

We claim:

1. An arrangement for an electronic cabinet having at least one removable electronic chassis enabling n plugs mounted on one of said chassis and said cabinet to reliably engage n receptacles mounted on the other of said chassis and said cabinet, where n is a natural number including one, comprising:
   a cabinet connector panel having at least one opening therein;
   a floating connector plate carrying one of said n plugs and said n receptacle, said plate being disposed in said opening to enable each of said one of said n plugs and said n receptacles to engage an associated one of the other of said n plugs and said n receptacles; and
   preloaded spring means connected between said panel and said plate enabling axial and radial displacement of said plate with respect to said panel to compensate for manufacturing tolerances of said cabinet, said chassis, said n receptacle and said n plugs and thereby ensuring a reliable engagement of said n plugs with said n receptacles;
   said preloaded spring means including
      a pair of stiffening members each secured to said panel adjacent opposite sides of said opening parallel to each other,
      at least one preloaded spring cell secured to each of said pair of stiffening members to establish a predetermined axial force at which said axial displacement can take place, and
      a plurality of floating members each rigidly secured to said plate and movably secured to an associated one of said spring cells to enable said radial displacement and to enable said axial displacement when said predetermined force is exceeded.

2. An arrangement according to claim 1, wherein each of said spring cells include
   a bolt extending through an associated one of said pair of stiffening members perpendicular to said panel,
   a cylindrical spacer disposed coaxial about said bolt to define said predetermined force after assembly of each of said spring cells and in a loose fitting relationship with an aperture in an associated one of said plurality of floating members to permit radial movement of said floating member,
   a first anti-friction member disposed between adjacent surfaces of said associated one of said pair of stiffening members and said associated one of said plurality of floating members,
   at least one helical spring disposed coaxially about said spacer,
   a pair of spring set members each disposed coaxially about said spacer and at opposite ends of said spring,
   a second anti-friction member disposed between adjacent surfaces of said associated one of said plurality of floating members and an adjacent one of said pair of spring seat members, and
   a fastening means threaded to the end of said bolt spaced from said panel bearing on the other of said pair of spring sets members and an adjacent end of said spacer to complete the assembly of each of said spring cells.

3. An arrangement according to claim 2, wherein said first anti-friction member includes
   at least one delvin strip.

4. An arrangement according to claim 3, wherein said second anti-friction member includes
   a nylon washer.

5. An arrangement according to claim 4, further including
   a second helical spring disposed coaxial of said spacer within said one helical spring extending between said pair of spring seat members.

6. An arrangement according to claim 5, wherein said fastening means includes
   a washer-nut combination.

7. An arrangement according to claim 6, wherein a plurality of said spring cells are secured to each of said pair of stiffening means.

8. An arrangement according to claim 7, further including
   a shock pin coupled to said panel to be received in a first cooperating mating arrangement in said chassis to provide a coarse alignment of said n plugs and said n receptacles.

9. An arrangement according to claim 8, further including
   a bar secured to said panel and said shock pin to absorb shock and vibration from said chassis.

10. An arrangement according to claim 9, further including
    an alignment pin secured to said plate to be received in a second cooperating mating arrangement in said chassis to provide an intermediate alignment of said n plugs and said n receptacles.

11. An arrangement according to claim 10, wherein said n plugs and said n receptacles provide a final alignment thereof.

12. An arrangement according to claim 11, wherein said panel includes a plurality of said openings each having disposed therein a different one of additional ones of said plates each carrying a different group of one of said n plugs and said n receptacles, and
    a different one of additional ones of said preloaded spring means is connected between said panel and each of said additional ones of said plates.

13. An arrangement according to claim 2, further including
    a second helical spring disposed coaxial of said spacer within said one helical spring extending between said pair of spring seat members.

14. An arrangement according to claim 13, wherein said fastening means includes
    a washer-nut combination.

15. An arrangement according to claim 14, wherein a plurality of said spring cells are secured to each of said pair of stiffening means.

16. An arrangement according to claim 15, further including
    a shock pin coupled to said panel to be received in a first cooperating mating arrangement in said chassis to provide a coarse alignment of said n plugs and said n receptacles.

17. An arrangement according to claim 16, further including
    a bar secured to said panel and said shock pin to absorb shock and vibration from said chassis.

18. An arrangement according to claim 17, further including
    an alignment pin secured to said plate to be received in a second cooperating mating arrangement in said chassis to provide an intermediate alignment of said n plugs and said n receptacles.

19. An arrangement according to claim 18, wherein said n plugs and said n receptacles provide a final alignment thereof.

20. An arrangement according to claim 19, wherein said panel includes a plurality of said openings each having disposed therein a different one of additional ones of said plates each carrying a different group of one of said n plugs and said n receptacles, and a different one of additional ones of said preloaded spring means is connected between said panel and each of said additional ones of said plates.

21. An arrangement according to claim 2, wherein said fastening means includes
a washer-nut combination.

22. An arrangement according to claim 21, wherein a plurality of said spring cells are secured to each of said pair of stiffening means.

23. An arrangement according to claim 22, further including
a shock pin coupled to said panel to be received in a first cooperating mating arrangement in said chassis to provide a coarse alignment of said n plugs and said n receptacles.

24. An arrangement according to claim 23, further including
a bar member secured to said panel and said shock pin to absorb shock and vibration from said chassis.

25. An arrangement according to claim 24, further including
an alignment pin secured to said plate to be received in a second cooperating mating arrangement in said chassis to provide an intermediate alignment of said n plugs and said n receptacles.

26. An arrangement according to claim 25, wherein said n plugs and said n receptacles provide a final alignment thereof.

27. An arrangement according to claim 26, wherein said panel includes a plurality of said openings each having disposed therein a different one of additional ones of said plates each carrying a different group of one of said n plugs and said n receptacles, and a different one of additional ones of said preloaded spring means is connected between said panel and each of said additional ones of said plates.

28. An arrangement according to claim 1 or 2, wherein
a plurality of said spring cells are secured to each of said pair of stiffening means.

29. An arrangement according to claim 28, further including
a shock pin coupled to said panel to be received in a first cooperating mating arrangement in said chassis to provide a coarse alignment of said n plugs and said n receptacles.

30. An arrangement according to claim 29, further including
a bar secured to said panel and said shock pin to absorb shock and vibration from said chassis.

31. An arrangement according to claim 30, further including
an alignment pin secured to said plate to be received in a second cooperating mating arrangement in said chassis to provide an intermediate alignment of said n plugs and said n receptacles.

32. An arrangement according to claim 31, wherein said n plugs and said n receptacles provide a final alignment thereof.

33. An arrangement according to claim 32, wherein said panel includes a plurality of said openings each having disposed therein a different one of additional ones of said plates each carrying a different group of one of said n plugs and said n receptacles, and a different one of additional ones of said preloaded spring means is connected between said panel and each of said additional ones of said plates.

34. An arrangement according to claim 1, further including
a shock pin coupled to said panel to be received in a first cooperating mating arrangement in said chassis to provide a coarse alignment of said n plugs and said n receptacles.

35. An arrangement according to claim 34, further including
a bar secured to said panel and said shock pin to absorb shock and vibration from said chassis.

36. An arrangement according to claim 35, further including
an alignment pin secured to said plate to be received in a second cooperating mating arrangement in said chassis to provide an intermediate alignment of said n plugs and said n receptacles.

37. An arrangement according to claim 36, wherein said n plugs and said n receptacles provide a final alignment thereof.

38. An arrangement according to claim 37, wherein said panel includes a plurality of said openings each having disposed therein a different one of additional ones of said plates each carrying a different group of one of said n plugs and said n receptacles, and a different one of additional ones of said preloaded spring means is connected between said panel and each of said additional ones of said plates.

* * * * *